(12) United States Patent
Ehrichs

(10) Patent No.: US 7,144,782 B1
(45) Date of Patent: Dec. 5, 2006

(54) SIMPLIFIED MASKING FOR ASYMMETRIC HALO

(75) Inventor: Edward E. Ehrichs, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 154 days.

(21) Appl. No.: 10/883,925

(22) Filed: Jul. 2, 2004

(51) Int. Cl.
*H01L 21/336* (2006.01)

(52) U.S. Cl. ............... 438/286; 438/525; 257/E21.618

(58) Field of Classification Search ............... 438/286, 438/525; 257/E21.618
See application file for complete search history.

(56) References Cited

U.S. PATENT DOCUMENTS

| | | | |
|---|---|---|---|
| 5,227,321 A | 7/1993 | Lee et al. | 437/44 |
| 5,580,804 A * | 12/1996 | Joh | 438/286 |
| 6,030,871 A | 2/2000 | Eitan | 438/276 |
| 6,114,211 A | 9/2000 | Fulford et al. | 448/305 |
| 6,489,223 B1 | 12/2002 | Hook et al. | 438/524 |
| 6,566,204 B1 * | 5/2003 | Wang et al. | 438/286 |
| 6,620,679 B1 | 9/2003 | Tzeng et al. | 438/250 |
| 6,747,325 B1 | 6/2004 | Shih | 257/408 |
| 6,784,062 B1 | 8/2004 | Cho et al. | 438/302 |
| 6,828,202 B1 | 12/2004 | Horch | 438/302 |
| 2003/0032231 A1 | 2/2003 | Efland et al. | 438/200 |

OTHER PUBLICATIONS

U.S. Appl. No. 10/693,016, filed Oct. 24, 2003, Goad et al.
U.S. Appl. No. 10/790,939, filed Mar. 1, 2004, Sultan et al.
Stanley Wolf and Richard N. Tauber; *Silicon Processing for the VLSI Era, vol. 3—The Submicron MOSFET*; pp. 226-232, 240, 309-311 and 621-622; 1995.
Terence B. Hook et al.; *High-Performance Logic and High-Gain Analog CMOS Transistors Formed by a Shadow-Mask Technique With a Single Implant Step*; IEEE Transactions on Electron Devices, vol. 49, No. 9, Sep. 2002; pp. 1623-1627.

* cited by examiner

*Primary Examiner*—Chandra Chaudhari
(74) *Attorney, Agent, or Firm*—Timothy M. Honeycutt

(57) ABSTRACT

Various methods of fabricating halo regions are disclosed. In one aspect, a method of manufacturing is provided that includes forming a symmetric transistor gate and an asymmetric transistor gate on a substrate. The symmetric and asymmetric transistor gates are substantially perpendicular. A mask is formed on the substrate with a first opening and a second opening. The first opening is sized to enable implantation of first and second halo regions beneath the symmetric transistor gate. The second opening is sized to enable implantation of a third halo region beneath and on one but not both sides of the asymmetric gate. The first and second halo regions are formed beneath the first gate by implanting through the first opening toward opposite sides of the symmetric gate. The third halo region is formed beneath and proximate one but not both sides of the asymmetric transistor gate by implanting through the second opening.

20 Claims, 4 Drawing Sheets

SIMPLIFIED MASKING FOR ASYMMETRIC HALO

BACKGROUND OF THE INVENTION

1. Field of the Invention

This invention relates generally to semiconductor processing, and more particularly to methods of forming halo regions.

2. Description of the Related Art

A typical field effect transistor implemented on a semiconductor substrate consists of a gate dielectric layer-gate electrode stack positioned on the substrate, and opposing source/drain impurity regions positioned in the substrate below the stack. The lateral separation between the pn junctions of the source/drain regions generally defines the channel length of the transistor. Some source/drain regions include extension regions that project laterally into the channel beneath the gate. When lightly doped, these extension structures are sometime called lightly doped drains ("LDD"). The purpose of the LDD structures is to provide a region of lighter doping beneath the gate electrode to reduce the drain junction potential.

Scaling of field effect transistor devices has historically been, and continues to be a fundamental goal in the semiconductor fabrication industry. The continual drive toward higher circuit density has been fueled by demands from ordinary consumers, industry, government and the military for ever increasing speed, capability and miniaturization of electronic products, as well as the desire of semiconductor manufacturers to reduce manufacturing costs. Scaling efforts have thus far been highly successful. Two micron processing, considered state of the art a little more than a decade ago, has given way to sub-micron processing.

As in many aspects of semiconductor processing, current efforts to scale transistor geometry involve a set of trade-offs between higher packing density, improved device performance, and short channel effects. As process technologies scaled below about 2.0 µm, a series of design difficulties arose stemming from the semiconductor physics associated with short-channel devices. Hot carrier effects and punch-through become much more problematic in short channel devices, such as modern field effect transistors in sub-2.0 µm processing. Without compensatory processing techniques, short channel effects can either reduce device performance or lead to device failure or both.

Halo structures have been used for several years in n-channel, p-channel and CMOS technologies as a means of controlling short channel effects in sub-0.5 µm critical dimension processing. A conventional halo structure consists of an implanted impurity region positioned lateral to the LDD of each source/drain region and provided with the same conductivity type as the channel. The conventional method of fabricating a halo structure entails a single large-angle-tilted ("LAT") ion implant that positions the halo structure around and under the vertical junctions of both the LDD and the overlapping heavier doped portion of the source/drain region. Halo regions are formed on both the source side and the drain side of the channel.

A difficulty associated with conventionally produced halo structures is the potential for limitations on carrier mobility and drive current to exist for a given level of leakage current. Halo regions positioned proximate both the source side and the drain side present an impediment to carrier mobility. The ability to reduce barriers to carrier mobility without significant increases in leakage currents holds the promise of squeezing even more performance out of halo implanted transistors.

The present invention is directed to overcoming or reducing the effects of one or more of the foregoing disadvantages.

SUMMARY OF THE INVENTION

In accordance with one aspect of the present invention, a method of manufacturing is provided that includes forming a symmetric transistor gate and an asymmetric transistor gate on a substrate. The symmetric transistor gate has first and second sides and the asymmetric transistor gate has third and fourth sides that are positioned substantially perpendicularly to the first and second sides. A mask is formed on the substrate with a first opening and a second opening. The first opening is sized to enable implantation of first and second halo regions beneath the symmetric transistor gate. The second opening is sized to enable implantation of a third halo region beneath the asymmetric gate proximate one but not the other of the third and fourth sides. The first and second halo regions of a first dosage are formed beneath the first gate by implanting off-axis through the first opening toward the first side and then the second side. The third halo region of a second dosage greater than the first dosage is formed beneath the asymmetric transistor gate by implanting off-axis through the second opening toward the third side and then the fourth side, a portion of the mask preventing a halo region from forming proximate the one of the third and fourth sides.

In accordance with another aspect of the present invention, a method of manufacturing is provided that includes forming a symmetric transistor that has a first gate on a substrate and an asymmetric transistor that has a second gate positioned substantially perpendicularly to the first gate on the substrate. A mask is formed on the substrate with a first opening and a second opening. The first opening is sized to enable implantation of first and second halo regions beneath and on opposite sides of the first gate. The second opening is sized to enable implantation of a third halo region beneath and one but not the other side of the second gate. The first and second halo regions of a first dosage are formed beneath and on opposite sides of the first gate by implanting off-axis through the first opening toward a first side and then a second and opposite side of the first gate. The third halo region of a second dosage greater than the first dosage is formed beneath and on the one side of the second gate by implanting off-axis through the second opening toward a third side and then a fourth and opposite side of the second gate while a portion of the mask prevents a halo region from forming proximate the other side of the second gate.

In accordance with another aspect of the present invention, a method of manufacturing is provided that includes forming a plurality of symmetric transistor gates and a plurality of asymmetric transistor gates on a substrate. Each of the plurality of symmetric transistor gates has first and second sides. Each of the plurality of asymmetric transistor gates has third and fourth sides that are positioned substantially perpendicularly to the first and second sides. A mask is formed on the substrate with a first opening and a second opening. The first opening is sized to enable implantation of first and second halo regions beneath each of the symmetric transistor gates. The second opening is sized to enable implantation of a third halo region beneath each of the asymmetric gates proximate one but not the other of the third and fourth sides. The first and second halo regions of a first dosage are formed beneath each of the plurality of symmetric transistor gates by implanting off-axis through the first opening toward the first sides and then the second sides. The third halo region of a second dosage greater than the first dosage is formed beneath and proximate the one of the third and fourth sides of each of the plurality of asymmetric transistor gates by implanting off-axis through the second opening toward the third sides and then the fourth sides, a portion of the mask preventing halo regions from forming proximate the other of the third and fourth sides.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
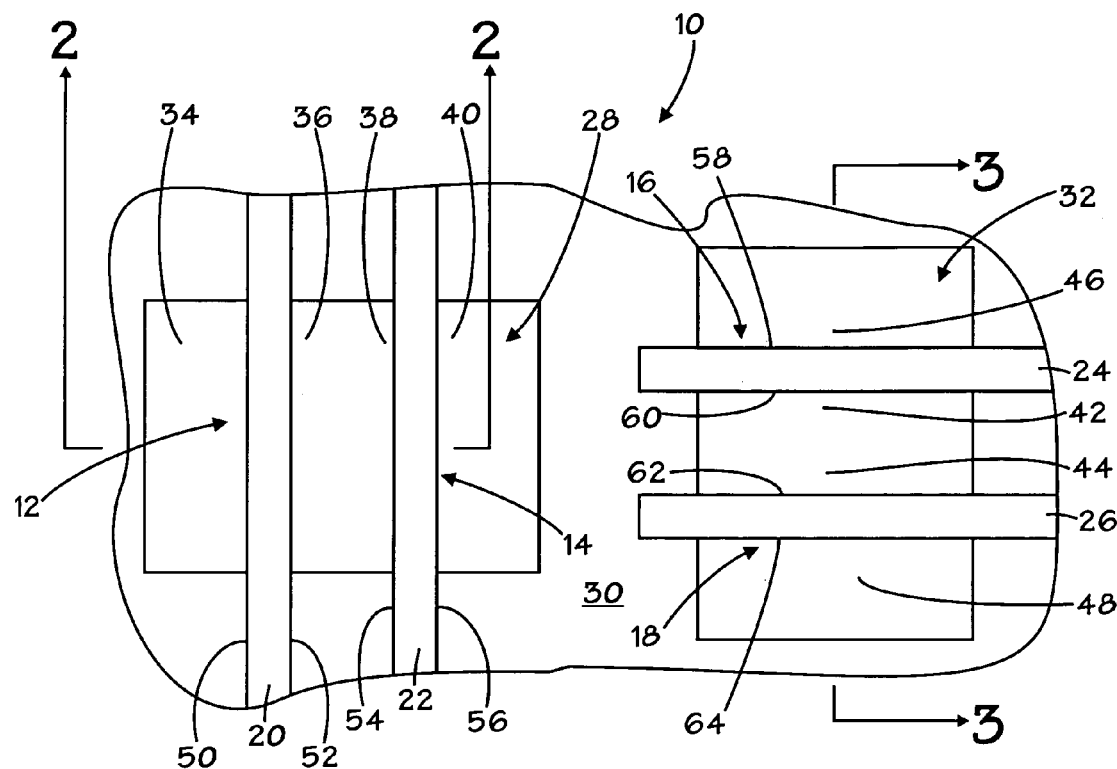
FIG. 1 is a plan view of a small portion of an integrated circuit in accordance with the present invention.

In the drawings described below, reference numerals are generally repeated where identical elements appear in more than one figure. Turning now to the drawings, and in particular to FIG. 1, therein is shown a plan view of a small portion of an integrated circuit 10. The integrated circuit 10 may include many circuit structures, such as resistors, transistors, capacitors and interconnects, to name just a few. A few of the possible circuit structures are depicted in FIG. 1, namely transistor devices 12, 14, 16, 18 and 20. The transistor devices 12, 14, 16 and 18 consist of respective gate structures 20, 22, 24 and 26. The transistors 12 and 14 are formed in a shared active region 28 that is circumscribed by an isolation structure 30. The gate structures 20 and 22 of the devices 12 and 14 are positioned over the active region 28. The transistors 16 and 18 are formed in a shared active region 32 that, like the active region 28, is circumscribed by the isolation structure 32. Optionally, discrete isolation structures may be provided for each of the active regions 28 and 30.

The gate structures 22, 24, 26, 28 and 30 may be fabricated by initially depositing a conducting or semiconducting material layer. The material layer may be composed of a variety of materials, such as, for example, polysilicon, amorphous silicon, aluminum, copper, gold, tantalum or the like. In an exemplary embodiment, the material is polysilicon. Well-known techniques for applying polysilicon, such as chemical vapor deposition ("CVD"), may be used to deposit the material layer. In an exemplary embodiment, the polysilicon is deposited by CVD at or above about 625° C. to a thickness of about 75.0 to 180.0 nanometers. Impurities for rendering the polysilicon conductive may be introduced via a dedicated gate implant before etch definition or via later impurity implants for source\drain regions to be described below.

The active region 32 is part of a much larger substrate and may be composed of a variety of semiconducting materials, such as, for example, silicon, germanium, or the like. While two shared active regions 28 and 32 are depicted, it should be understood that the transistor devices 12, 14, 16 and 18 may be alternatively implemented on discrete active regions or a combination of shared and discrete active regions.

The isolation structure 30 is designed to provide lateral electrical isolation from other electrical structures on the integrated circuit 10. Various structural forms and electrically insulating materials may be used to fabricate the isolation structure 30, such as, for example, shallow trench isolation, deep trench isolation, field oxide, or other isolation structures composed of silicon dioxide, tetra-ethyl-orthosilicate ("TEOS"), or other suitable isolation materials.

Vertical electrical isolation for the active region 32 may be provided by impurity wells, by implementing the active region on a semiconductor-on-insulator substrate or other well-known techniques.

In the illustrated embodiment, the transistor devices 12, 14, 16 and 18 are implemented as field effect transistors. The transistor devices 12 and 14 are implemented as "symmetric transistors." In this regard, the transistor 12 is provided with source/drain regions 34 and 36, and the transistor 14 is provided with source/drain regions 38 and 40. In a symmetric transistor, the source and drain swap functions. Depending upon the interconnections to power, ground or other conductors and the bias state of the symmetric transistor, the portions of the active region on either side of the gate may function as either a source or a drain. This swapping of source and drain functions is useful in a variety of contexts in integrated circuits, such as, for example, as pass transistors in memory devices. In contrast, the transistor devices 16 and 18 are implemented as "asymmetric transistors," and provided with respective source regions 42 and 44, and drain regions 46 and 48. In an asymmetric transistor, the source and drain do not swap functions during device operation.

The various source/drain regions 34, 36, 38 and 40, source regions 42 and 44, and drain regions 46 and 48 may be formed using a variety of well-known techniques for establishing such impurity regions, such as ion implantation, diffusion, in-situ doping or the like. If the gate structures 20, 22, 24 and 26 require impurity concentrations for proper conductivity, the formation process for the various source/drain regions 34, 36, 38 and 40, source regions 42 and 44, and drain regions 46 and 48 may supply the requisite impurities. Optionally, other processes, implants, diffusion or the like, may be used. One or more spacers (not shown) may be used to provide any desired lateral offsets.

The symmetric transistors 12 and 14 are oriented substantially perpendicularly to the asymmetric transistors 16 and 18. In this regard, portions of the respective edges 50, 52, 54 and 56 of the gates 20 and 22 overlying the source/drain regions 34, 36, 38 and 40 are substantially perpendicular to portions of the respective edges 58, 60, 62 and 64 of the gates 24 and 26 overlying the source regions 42 and 44 and drain regions 46 and 48. Of course, the portions of the gate edges 50, 52, 54 and 56 that do not overlie the source/drain regions 34, 36, 38 and 40 may be substantially perpendicular to the portions of the gate edges 58, 60, 62 and 64 that do not overlie the sources 42 and 44 and the drains 46 and 48. The rationale behind making the symmetric transistors 12 and 14 substantially perpendicular to the asymmetric transistors 16 and 18 is to simplify the masking necessary to form halo regions for the transistors 12, 14, 16 and 18. This concept will be described in more detail below.

Figure 2:
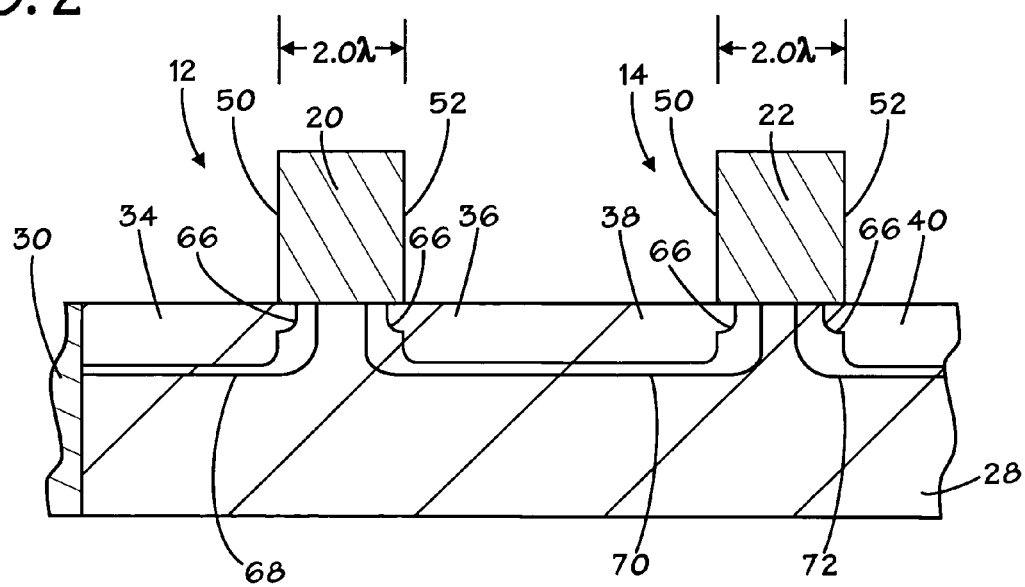
FIG. 2 is a cross-sectional view of FIG. 1 taken at section 2—2 in accordance with the present invention.

As noted in the Background section above, halo implants have been used as a means of altering the threshold voltage of a field effect transistor. The benefits of utilizing halo regions may be extended by tailoring the implant and masking scheme in order to account for differences between symmetric and asymmetric transistor devices. A goal of the process of the present invention may be understood by referring now also to FIGS. 2 and 3, which are cross-sectional views of FIG. 1 taken at sections 2—2 and 3—3. The symmetric device 12 and the symmetric device 14 are visible in FIG. 2, as well as the active region 32 and a small portion of isolation structure 30. The asymmetric devices 16 and 18 are visible in FIG. 3, as well as the active region 32 and small portions of the isolation structure 30. At this stage, the gates 22 and 24 of the devices 12 and 14 and the gates 24 and 26 of the devices 16 and 18 may have a lateral dimension 2.0$\lambda$ where $\lambda$ is some targeted final lateral dimension. For example, the dimension 2.0$\lambda$ may represent the width of the gates 20, 22, 24 and 26 following lithographic and etch patterning, while the dimension $\lambda$ may represent the width of the gates 20, 22, 24 and 26 following one or more trim processes, such as etch trims.

Figure 3:
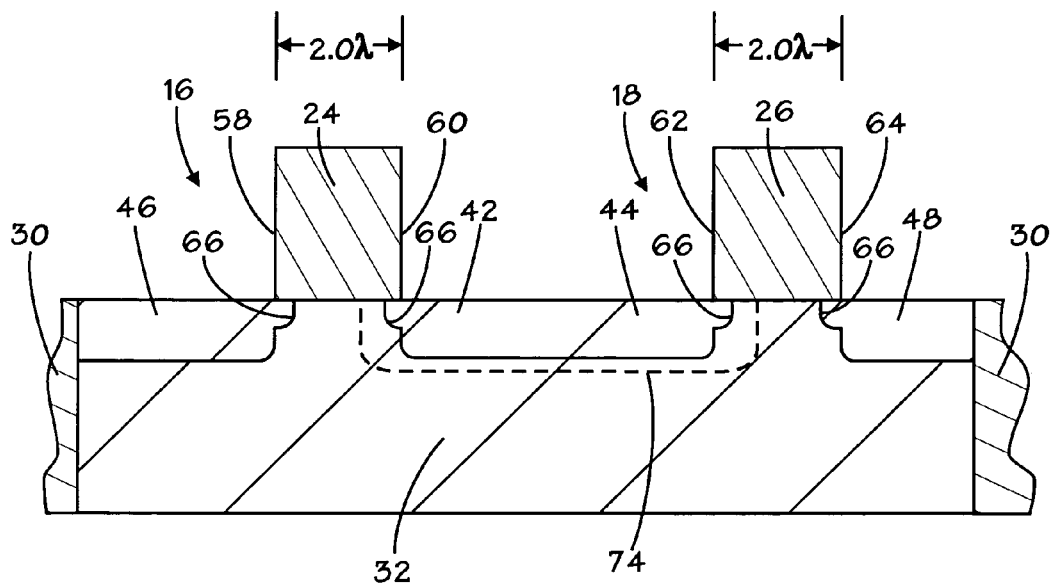
FIG. 3 is a cross-sectional view of FIG. 1 taken at section 3—3 in accordance with the present invention.

The impurity regions 34, 36, 38, 40, 42, 44, 46 and 48 may be provided with respective extension regions 66 that overlap the gate edges 50, 52, 54, 56, 58, 60, 62 and 64 as shown. Optionally, single-graded impurity regions may be used As described in more detail below, a masking and implant scheme is presented that provides for: (1) the formation of halo region 68, 70 and 72 with a nominal impurity dosage proximate the source/drain regions 34, 36, 38 and 40 of the symmetric devices 12 and 14; (2) no formation of a halo regions proximate the respective drains 46 and 48 of the asymmetric devices 16 and 18 as shown in FIG. 3; and (3) and the formation of a halo region 74 as shown in FIG. 3 with a nominal impurity dosage higher than that of the halo regions 68, 70 and 72. For example, the dosage for the halo regions 68, 70 and 72 may be about 1.0X and the dosage for the halo region 74 may be about 2.0X where X is some nominal dosage. These dosage values are exemplary. It should understood that the goal is to provide a heavier dosage in the halo region 74 than in the halo regions 68, 70 and 72. Other than a 2:1 ratio may be appropriate.

Figure 4:
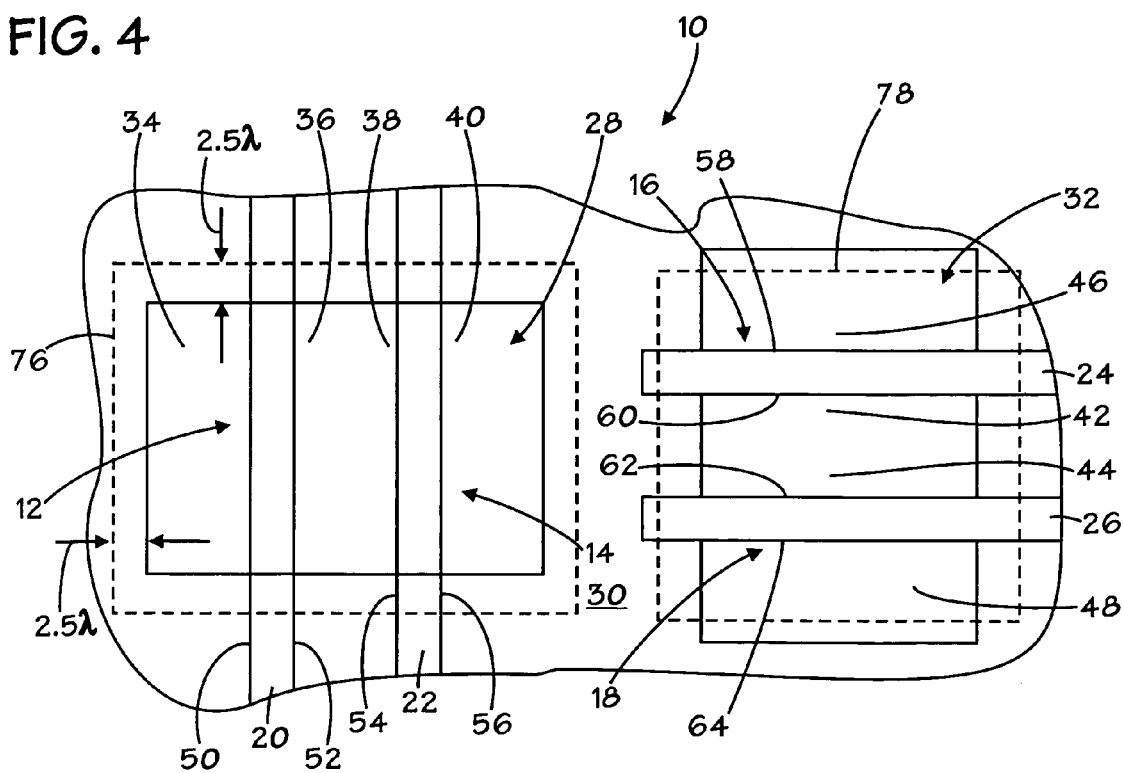
FIG. 4 is another plan view of the integrated circuit depicted in FIG. 1 showing an anticipated halo implant mask layout in accordance with the present invention.

An exemplary process flow for implementing the selective halo formation in accordance with the present invention may be understood by referring now to FIGS. 4, 5, 6 and 7 and initially to FIG. 4. Like FIG. 1, FIG. 4 is a plan view of the integrated circuit 10. The portion of the active region 28 targeted for halo implantation of the symmetric devices 12 and 14 is illustrated by the dashed box 76. Similarly, the portion of the active region 32 targeted for halo implantation of the asymmetric devices 16 and 18 is illustrated by the dashed box 78. The dimensions of the target area 76 should be such that a later-formed mask with an opening corresponding to the layout of the target area 76 will not shadow the source/drain regions 34, 36, 38 and 40, particularly in the vicinity of the gate edges 50, 52, 54 and 56 during halo implantation to form the halo regions 68, 70 and 72 (see FIG. 2) beneath the gates 20 and 22. The actual dimensions of the target area 76 will depend on, inter alia, the height of the subsequently-formed mask, the dimension $\lambda$, and some rules of thumb that are intended to account for potential errors in mask lithography. For example, the target area 76 may be dimensioned so that it extends laterally a distance of about 2.5$\lambda$ to either side of the edges of the active region 28.

The dimensions of the target area 78 should be such that a later-formed mask with an opening corresponding to the layout of the target area 78 will shadow the drain regions 46 and 48 of the devices 16 and 18 during halo implantation to the form halo region 74 (see FIG. 3) beneath the gates 24 and 26. The actual dimensions of the target area 78 will depend on, inter alia, the height of the subsequently-formed mask, the dimension $\lambda$, and some rules of thumb that are intended to account for potential errors in mask lithography. For example, the target area 78 may be dimensioned so that it: (1) extends laterally away from the gate edges 58 and 64 a distance that is about 1.5$\lambda$ short of the boundaries of the active region 32; and (2) extends laterally a distance of about 2.5 to either side of the edges of the active region 32.

Figure 5:
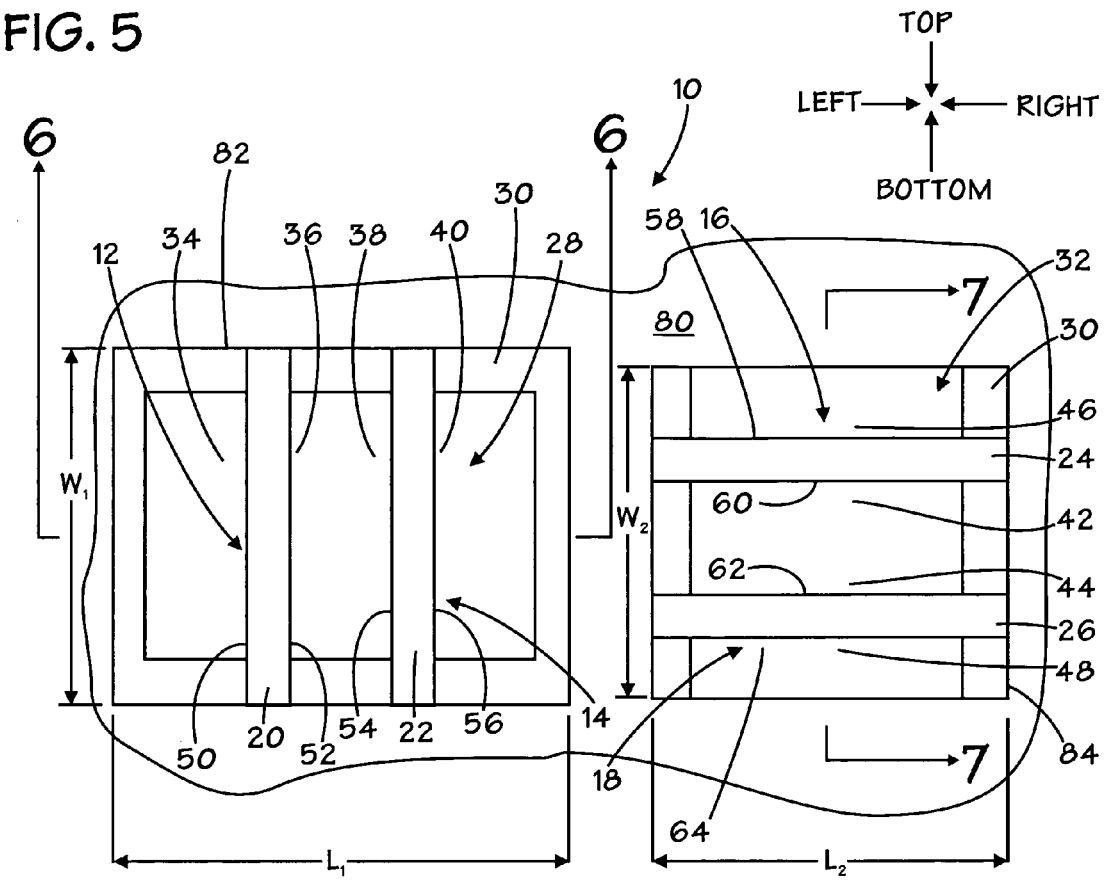
FIG. 5 is another plan view of the integrated circuit depicted in FIG. 4 with a mask formed thereon in accordance with the present invention.

FIG. 5 illustrates a plan view of a masking of the integrated circuit 10 that is a prelude to a halo implantation of both the symmetric devices 12 and 14 and the asymmetric devices 16 and 18. A mask 80 is patterned over the integrated circuit 10 with an opening 82 corresponding to the layout of the dashed box 76 and an opening 84 corresponding to the layout of the dashed box 78 in FIG. 4. The opening 82 may have a width $W_1$ and a length $L_1$. Using the aforementioned rules of thumb, the width $W_1$ may be about 5.0$\lambda$ plus the width of the active region 28, and the length $L_1$ may be about 5.0$\lambda$ plus the length of the active region 28. Similarly, the opening 84 may have a width $W_2$ of about the width of the active region 32 minus 3.0$\lambda$, and a length $L_2$ of about the length of the active region 32 plus 5.0$\lambda$.

The mask 80 may be formed from positive or negative tone photoresist. The type of photoresist selected will depend on the wavelength of exposure radiation and ability of the resist to be applied with a desire thickness range. In an exemplary embodiment, a JSR Corp.'s KrF M20G positive tone photoresist may be used. Optionally, a hard mask of oxide, nitride, laminates of these or the like may be formed, albeit with a greater process complexity.

The opening 82 exposes portions of the underlying symmetric devices 12 and 14 while the opening exposes portions of the underlying asymmetric devices 16 and 18. Note that portions of the active region 28, the isolation structure 30 and the gates 20, 22, 24 and 26 are visible. It is desired to halo implant the active region 28 on both sides of and with substantial penetration beneath the gates 20 and 22. In this regard, "off-axis" implantation, that is, a tilted-angle implantation at an implant angle $\theta$ relative to vertical is used. Since halos are needed for both sides of the gates 20 and 22, the halo implants may be performed toward one side and then the other side of the gates 20 and 22, or in other words with a twist, that is, an angle relative to the edges 50, 52, 54 and 56 of the gates 20 and 22. The twist angle is usually orthogonal to the edges 50, 52, 54 and 56 so that greatest penetration beneath the gates 20 and 22 is achieved. However, the twist angle may be somewhat less than strictly perpendicular if desired. For the orientation of the gates 20 and 22 in FIG. 5, implants will be performed at a "RIGHT" and "LEFT" twist. Note that the assignment of directions "RIGHT," "LEFT" etc. to the twist parameters in FIG. 5 is somewhat arbitrary.

Figure 6:
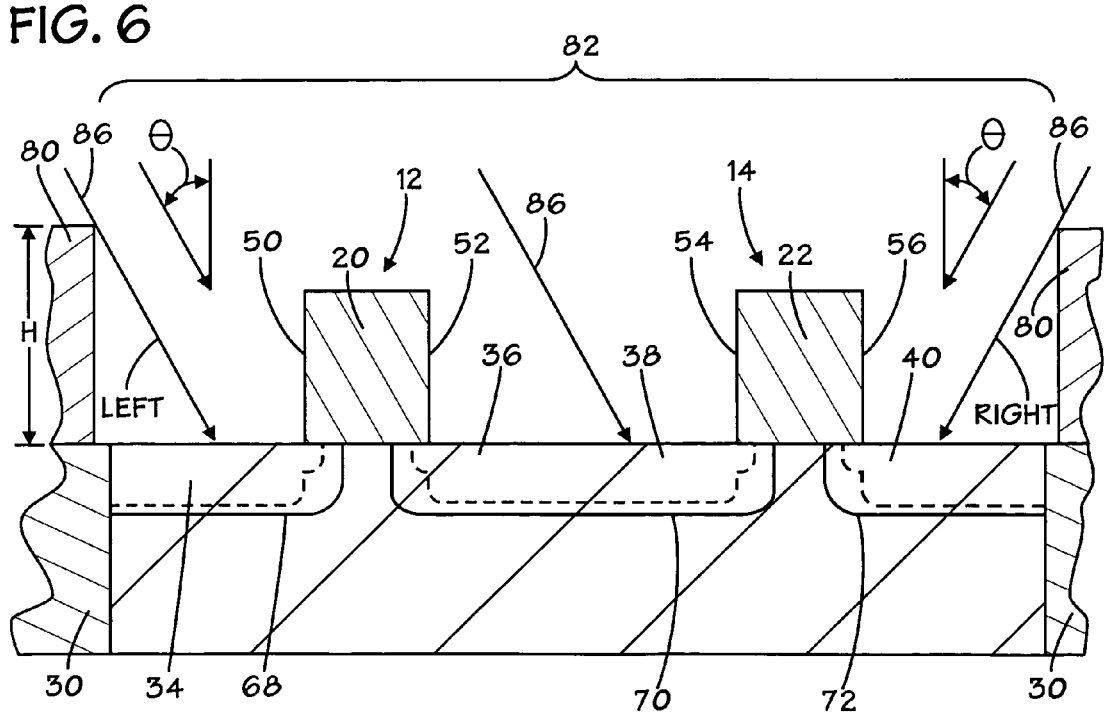
FIG. 6 is a cross-sectional view of FIG. 5 taken at section 6—6 and depicts halo implantation of a portion of the integrated circuit in accordance with the present invention.

FIG. 6 depicts a cross-sectional view of FIG. 5 taken at section 6—6. The mask 80 is advantageously formed with a height H. The height H is selected in conjunction with the length $L_1$ of the opening 82 as described above so that the two halo implants, one with a RIGHT twist and one with a LEFT twist and performed at an implant angle $\theta$ with respect to vertical, may establish symmetric 1.0X dosage halo regions 68, 70 and 72 beneath the gates 20 and 22 as shown. The length $L_1$ and the height H are selected so that there is little shadowing of the source/drain regions 34, 36, 38 and 40, particularly in the vicinity of the gate edges 50, 52, 54 and 56 when ions 86 are implanted. In an exemplary embodiment, the height H may be about 100.0 to 500.0 nm.

In this exemplary embodiment, the source/drain regions 34, 36, 38 and 40 are formed after the halo implants, and thus are depicted in dashed in FIG. 6. However, the skilled artisan will appreciate that portions or all of the source/drain regions 34, 36, 38 and 40 could be formed prior to halo implantation.

Figure 7:
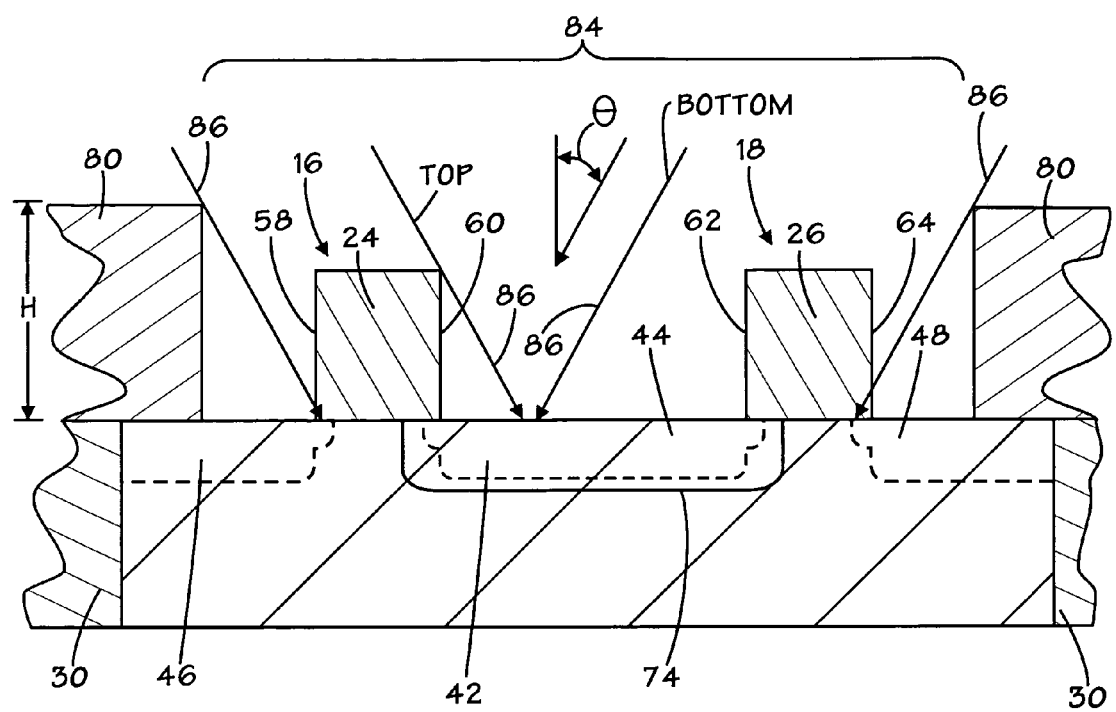
FIG. 7 is a cross-sectional view of FIG. 5 taken at section 7—7 and depicts halo implantation of another portion of the integrated circuit in accordance with the present invention.

FIG. 7 depicts a cross-sectional view of FIG. 5 taken at section 7—7. The mask 80 is advantageously formed with a height H. The height H of the mask 80 is selected not only in conjunction with the length $L_1$ of the opening 82 as described above, but also in conjunction with the width $W_2$ of the opening 84 so that the two halo implants, one with a TOP twist and one with a BOTTOM twist and performed at an implant angle θ with respect to vertical, may establish an asymmetric 2.0X dosage halo region 74 that is shared by the devices 16 and 18. Of course, if there is only one asymmetric transistor requiring halo implantation, then only one implant need be performed at a TOP or BOTTOM twist in order to form a halo proximate one of the source regions 42 or 44, but not the drains 46 and 48. Here, the width $W_2$ and the height H are selected so that there is pronounced shadowing of the drain regions 46 and 48, but little shadowing of the source regions 42 and 44, particularly in the vicinity of the gate edges 60 and 62 when the ions 86 are implanted. The source/drain regions 42, 44, 46 and 48 are formed after the halo implants, and thus are depicted in dashed in FIG. 7. However, the skilled artisan will appreciate that portions or all of the source/drain regions 42, 44, 46 and 48 could be formed prior to halo implantation.

The parameters for the halo implants are largely matters of design discretion. In an exemplary embodiment, a p-type species, such as boron or $BF_2$ may be used for an n-channel device, and an n-type species, such as arsenic or antimony may be used for a p-channel device. The energy may be about 3 to 80 keV, the nominal dosage X may be about 1E13 to 1E14 $cm^{-2}$ and the angle θ may be about 16 to 45°. It should be understood that p-channel and n-channel devices will be separately masked and halo implanted. Thus, the masking steps just illustrated would be appropriate if the devices were of the same type, such as n-type. Thus, any p-type devices would undergo a similar but separate masking and implant process.

Following the implantation, the mask 80 is stripped. Stripping may be accomplished by ashing, solvent stripping, combinations of the two or the like.

The process and devices in accordance with the present invention provide for halo formation in a simplified single-masking step. Although a layout constraint is imposed, the overall processing is simplified.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a symmetric transistor gate and an asymmetric transistor gate on a substrate, the symmetric transistor gate having first and second sides, the asymmetric transistor gate having third and fourth sides being positioned substantially perpendicularly to the first and second sides;
   forming a mask on the substrate with a first opening and a second opening, the first opening being sized to enable implantation of first and second halo regions beneath the symmetric transistor gate, the second opening being sized to enable implantation of a third halo region beneath the asymmetric gate proximate one but not the other of the third and fourth sides;
   forming the first and second halo regions of a first dosage beneath the first gate by implanting off-axis through the first opening toward the first side and then the second side; and
   forming the third halo region of a second dosage greater than the first dosage beneath the asymmetric transistor gate by implanting off-axis through the second opening toward the third side and then the fourth side, a portion of the mask preventing a halo region from forming proximate the one of the third and fourth sides.

2. The method of claim 1, wherein the second dosage is about twice the first dosage.

3. The method of claim 1, comprising forming the symmetric and asymmetric transistor gates on a shared active region.

4. The method of claim 1, comprising forming source/drain regions beneath the symmetric transistor gate, a drain region beneath the asymmetric transistor gate, and a source region beneath the asymmetric transistor gate proximate the third halo region.

5. The method of claim 4, wherein the source/drain regions, the source region and the drain region comprise extension regions.

6. The method of claim 1, wherein the symmetric transistor is not formed adjacent to the asymmetric transistor.

7. The method of claim 1, wherein the implanting through the first and second openings comprises implanting n-type impurity.

8. The method of claim 1, wherein the implanting through the first and second openings comprises implanting p-type impurity.

9. A method of manufacturing, comprising:
   forming a symmetric transistor having a first gate on a substrate and an asymmetric transistor having a second gate positioned substantially perpendicularly to the first gate on the substrate;
   forming a mask on the substrate with a first opening and a second opening, the first opening being sized to enable implantation of first and second halo regions beneath and on opposite sides of the first gate, the second opening being sized to enable implantation of a third halo region beneath and one but not the other side of the second gate;
   forming the first and second halo regions of a first dosage beneath and opposite sides of the first gate by implanting off-axis through the first opening toward a first side and then a second and opposite side of the first gate; and
   forming the third halo region of a second dosage greater than the first dosage beneath and on the one side of the second gate by implanting off-axis through the second opening toward a third side and then a fourth and opposite side of the second gate, a portion of the mask preventing a halo region from forming proximate the other side of the second gate.

10. The method of claim 9, wherein the second dosage is about twice the first dosage.

11. The method of claim 9, comprising forming the symmetric and asymmetric transistors on a shared active region.

12. The method of claim 9, wherein the symmetric transistor is formed adjacent to the asymmetric transistor.

13. The method of claim 9, wherein the symmetric transistor is not formed adjacent to the asymmetric transistor.

14. The method of claim 9, wherein the implanting through the first and second openings comprises implanting n-type impurity.

15. The method of claim 9, wherein the implanting through the first and second openings comprises implanting p-type impurity.

16. A method of manufacturing, comprising:

forming a plurality of symmetric transistor gates and a plurality of asymmetric transistor gates on a substrate, each of the plurality of symmetric transistor gates having first and second sides, each of plurality of asymmetric transistor gates having third and fourth sides being positioned substantially perpendicularly to the first and second sides;

forming a mask on the substrate with a first opening and a second opening, the first opening being sized to enable implantation of first and second halo regions beneath each of the symmetric transistor gates, the second opening being sized to enable implantation of a third halo region beneath each of the asymmetric gates proximate one but not the other of the third and fourth sides;

forming the first and second halo regions of a first dosage beneath each of the plurality of symmetric transistor gates by implanting off-axis through the first opening toward the first sides and then the second sides; and forming the third halo region of a second dosage greater than the first dosage beneath and proximate the one of the third and fourth sides of each of the plurality of asymmetric transistor gates by implanting off-axis through the second opening toward the third sides and then the fourth sides, a portion of the mask preventing halo regions from forming proximate the other of the third and fourth sides.

17. The method of claim 16, wherein the second dosage is about twice the first dosage.

18. The method of claim 16, comprising forming the plurality of symmetric transistor gates on a first shared active region and the plurality of asymmetric transistor gates on a second shared active region.

19. The method of claim 16, wherein the implanting through the first and second openings comprises implanting n-type impurity.

20. The method of claim 16, wherein the implanting through the first and second openings comprises implanting p-type impurity.

* * * * *